United States Patent [19]

Taylor

[11] Patent Number: 5,030,925
[45] Date of Patent: Jul. 9, 1991

[54] TRANSIMPEDANCE AMPLIFIER

[75] Inventor: Stewart S. Taylor, Beaverton, Oreg.

[73] Assignee: TriQuint Semiconductor, Inc., Beaverton, Oreg.

[21] Appl. No.: 494,065

[22] Filed: Mar. 15, 1990

[51] Int. Cl.[5] ............................................. H03F 3/08
[52] U.S. Cl. ................................ 330/308; 250/214 A; 330/110; 330/296
[58] Field of Search ................ 330/59, 110, 303, 306, 330/308, 296; 250/214 A, 214 AG; 455/619

[56] References Cited

U.S. PATENT DOCUMENTS

| | | | |
|---|---|---|---|
| 3,999,060 | 12/1976 | Skagerlund | 330/110 X |
| 4,218,613 | 8/1980 | Bletz | 330/110 X |
| 4,415,803 | 11/1983 | Muoi | 250/214 A |
| 4,540,952 | 9/1985 | Williams | 330/279 |
| 4,620,321 | 10/1986 | Chown | 330/308 X |

FOREIGN PATENT DOCUMENTS

| | | | |
|---|---|---|---|
| 222748 | 5/1985 | German Democratic Rep. | 330/308 |
| 273021 | 11/1988 | Japan | 250/214 A |

OTHER PUBLICATIONS

"Infra-Red Receiver", *Electronics Today International*, vol. 10, No. 11, Nov. 1981, p. 68.

*Primary Examiner*—James B. Mullins
*Attorney, Agent, or Firm*—Alan T. McCollom; Peter J. Meza

[57] ABSTRACT

A transimpedance amplifier comprises a transconductance amplifier having a nonlinear resistive feedback element. The feedback element includes a pair of resistors and a pair of diodes, one of which conducts (depending upon the voltage polarity) only when the voltage across the diode exceeds the diode on-voltage. This includes additional resistance in the feedback element thereby changing the amplifier gain. The largest value of the resistive feedback element is substantially equal to or less than the output resistance of the transconductance amplifier. The feedback element is both symmetrical and nonlinear. A shunt amplifier is driven by circuit which produces a control signal that varies with a signal current. Increasing signal current increases the DC current shunted from the amplifier input thus decreasing pulse edge distortion and increasing dynamic range. A capacitor AC couples the current input to the amplifier.

27 Claims, 3 Drawing Sheets

TRANSIMPEDANCE AMPLIFIER

BACKGROUND OF THE INVENTION

1. Field of the Invention

The present invention relates to signal amplifiers and more particularly to such amplifiers which produce an output voltage signal proportional to an input current signal and which are generally known as transimpedance amplifiers.

2. Description of the Related Art

Prior art transimpedance amplifiers are typically implemented by providing a feedback resistor across the input and output of a voltage amplifier. The current signal applied to the amplifier input is thus passed substantially through the feedback resistor because of the high input impedance of the voltage amplifier. A voltage proportional to the input current thus appears on the amplifier output.

One such prior art transimpedance amplifier shown in FIG. 5 of U.S. Pat. No. 4,540,952 issued to Williams for a nonintegrating receiver.

A typical use for transimpedance amplifiers is in optical transmission systems. An optical source, such as a laser or light emitting diode, is used to transmit information by modulating the intensity of the light source. An electrooptic device such as a PIN diode or avalanche photodiode receives the optical signal and converts the same to a current which is applied to the input of the transimpedance amplifier. The amplifier thus produces a voltage proportional to the diode current. In optical transmission systems the information transmitted is usually digital and generally is in the form of a pulse train.

Optical transmission systems are typically designed to provide an electrical output signal which has a predetermined amplitude. In the prior art, an automatic gain control (AGC) is used in conjunction with the transimpedance amplifier described above in order to produce an output voltage which comprises a pulse train switched in accordance with the optical source and having a substantially constant amplitude when the input signal is larger than a preselected threshold. Increasing the gain for low signal inputs thus increases the dynamic range of the amplifier.

One such AGC circuit is described in U.S. Pat. No. 4,415,803 to Muoi for an optical receiver with improved dynamic range. Such an AGC circuit effectively varies the gain of the transimpedance amplifier in order to maintain the output signal at the desired amplitude for signals above the threshold. In transimpedance amplifiers which are implemented with voltage amplifiers, varying the value of the feedback resistance varies the amplifier bandwidth. The closed-loop $-3db$ bandwidth for such an amplifier is approximately equal to $A_v/(2\pi R_f C_t)$, where $A_v$ is the amplifier gain, $R_f$ is the value of the feedback resistance and $C_t$ is the total input capacitance of the diode, the amplifier and any other parasitic capacitance. The bandwidth of the amplifier thus varies with the value of the feedback resistance as in several embodiments disclosed in the Williams patent.

Should the bandwidth fall too low, undesirable filtering of the signal occurs. On the other hand, if the bandwidth becomes too high, overshoot, ringing, and, in extreme cases, amplifier oscillation occurs, thus producing at the very least, an increase in the error rate of information passed. Furthermore, increased bandwidth also increases noise and therefore the error rate. It would thus be desirable to provide a transimpedance amplifier having a variable gain and a constant bandwidth.

In another prior art device for increasing the dynamic range of an amplifier, a FET is used as a resistive shunt to reduce the value of the current applied to the input terminal of the amplifier in order to increase dynamic range. In such a circuit, one side of the FET is connected to the amplifier input, the other side is connected to a bias voltage and the gate is connected to the output of an AGC circuit which produces a control signal which varies in response to the amplifier output. For high input signal levels, more amplifier input current is shunted thereby increasing the dynamic range of the amplifier. In order to be effective, such a FET must typically have a resistance of 10 ohms or less. Such a FET is typically one to several thousand microns wide. This takes up a tremendous amount of space on a chip and also adds a large amount of unwanted capacitance which lowers the bandwidth and degrades the noise performance.

SUMMARY OF THE INVENTION

The present invention comprises a method of producing a voltage signal proportional to a current signal. A transconductance amplifier has an input terminal, an output terminal and a feedback element disposed therebetween. The output resistance of the transconductance amplifier is chosen to be substantially equal to or greater than the resistance of the feedback element. A current signal is provided on the amplifier input terminal and thereafter the resistance of the feedback element is varied.

In another aspect of the invention, means for removing DC current from the current signal applied to said input terminal is provided.

Apparatus for implementing the method is also provided.

It is a general object of the present invention to provide a transimpedance amplifier having increased dynamic range.

It is another object of the present invention to provide a transimpedance amplifier having variable gain and constant bandwidth.

It is a more specific object of the present invention to provide such an amplifier having variable gain which is not implemented with a large shunt, low resistance element such as a FET.

It is another specific object of the present invention to provide such an amplifier with a high impedance shunt bias element for further increasing the dynamic range of the amplifier and for reducing distortion.

The foregoing and other objects, features and advantages of the invention will become more readily apparent from the following detailed description of a preferred embodiment which proceeds with reference to the drawings.

BRIEF DESCRIPTION OF THE DRAWINGS

FIG. 3 is a more detailed schematic diagram of a transimpedance amplifier similar to the transimpedance amplifier of. FIG. 2.

DETAILED DESCRIPTION OF THE PREFERRED EMBODIMENTS

Figure 1:
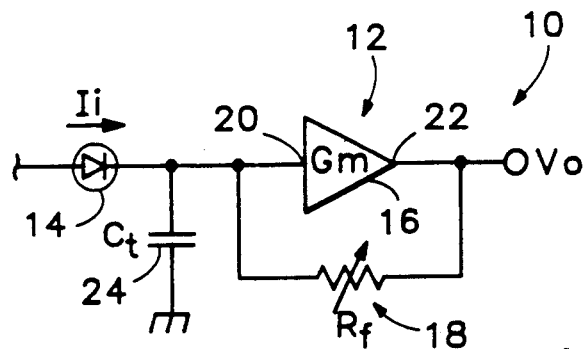
FIG. 1 is a schematic diagram of transimpedance amplifier constructed in accordance with the present invention.

Turning now to FIG. 1, indicated generally at 10 is an optical receiver circuit constructed in accordance with the present invention. Included therein is a transimpedance amplifier, indicated generally at 12, and an optical detector or photodiode 14.

Transimpedance amplifier 12 includes a transconductance amplifier 16 and a variable resistive feedback element 18. Amplifier 16 includes an input terminal 20 and an output terminal 22.

Transconductance amplifier 16 is, in the embodiment of FIG. 1, a conventional transconductance amplifier. As such, it supplies an output current proportional to its input voltage. Such amplifiers typically have high input and output impedances. Resistive feedback element 18 has one end thereof electrically connected to input terminal 20 and the other end thereof electrically connected to output terminal 22. As will shortly be seen, the addition of element 18 causes amplifier 16 to operate as a transimpedance amplifier which produces an output voltage proportional to an input current.

A capacitor 24 is connected between terminal 20 and ground and represents the sum of capacitance from several sources, namely the capacitances of diode 14 and amplifier 16 as well as parasitic capacitance from all other sources. The anode of diode 14 is connected to a circuit (not shown) for providing an appropriate bias voltage.

In operation, light strikes photodiode 14 thus producing a current, $i_i$ through the photodiode. Because of the high input impedance of amplifier 16, the great majority of $i_i$ is conducted through resistive feedback element 18. The intensity of the light striking photodiode 14 proportionately varies the intensity of current $i_i$. In a manner which will be hereinafter explained, for low values of $i_i$, resistive feedback element 18 has a high resistance thus increasing the gain of transimpedance amplifier 12. For high values of $i_i$, the resistance of element 18 is at a lower value thus reducing the gain of amplifier 12. Thus, wide dynamic range is achieved. Optical receiver circuit 10 in FIG. 1 operates as described while maintaining a substantially constant bandwidth for varying resistance values of feedback element 18. This is demonstrated by the following equations. The closed loop bandwidth is calculated as follows:

Equation No. 1

$$f_{-3db} \text{(closed loop)} = (1+T)f_{-3db} \text{(open loop)}$$

where T is equal to the loop gain. Equation 1, as are the following equations, is based on conventional feedback analysis as described, e.g., in Gray, Paul R. & Meyer, Robert G., *Analysis and Design of Analog Integrated Circuits* (Second Ed. 1984).

Equation No. 2

$$T = af$$

where a is the transfer function of the amplifier and f is the transfer function of the feedback network. For transconductance amplifier 16:

Equation No. 3

$$a = v_o/i_i$$

where $v_o$ is the voltage on terminal 22 and $i_i$ is the input current applied to terminal 20. The transconductance of amplifier 16 is as follows:

Equation No. 4

$$G_m = i_o/v_i$$

where $i_o$ is the output current in the conductor connected to terminal 22 and $v_i$ is the voltage appearing at terminal 20. For input and output impedances of amplifier 16 which are greater than the resistance of feedback element 18:

Equation No. 5

$$v_o = R_f i_o$$

and

Equation No. 6

$$i_i = v_i/R_f$$

Substituting equations 5 and 6 into equation 3 yields:

Equation No. 7

$$a = v_o/i_i = (R_f i_o R_f)/v_i$$

Further substituting equation 4 into the last part of equation 7:

Equation No. 8

$$a = R_f^2 G_m$$

The feedback network transfer function is:

Equation No. 9

$$f = i_{fb}/v_o = 1/R_f$$

Using the values in equations 8 and 9 in equation 2 provides the loop gain:

Equation No. 10

$$T = af = G_m R_f$$

With the values of $G_m$ and $R_f$ selected so that $T \gg 1$, equation 1 can be rewritten:

Equation No. 11

$$f_{-3db} \text{(closed loop)} = T f_{-3db} \text{(open loop)}$$

The open loop bandwidth of transimpedance amplifier 12 is:

Equation No. 12

$$f_{-3db} \text{(open loop)} = 1/(2\pi R_f C_t)$$

Substituting equation 12 into equation 11 yields:

Equation No. 13

$$f_{-3db}\text{(closed loop)} = (G_m R_f)/(2\pi R_f C_t) = G_m/(2HC_t)$$

It can thus be seen that even when $R_f$ is varied to change the gain, and thus increase the dynamic range of transimpedance amplifier 12, the bandwidth remains substantially constant. Thus, reduction of the bandwidth which precludes accurate amplification of signals of interest is prevented. In addition, increasing bandwidth, which can increase noise and cause ringing, overshoot and the like, is also prevented. It should be appreciated that if the output resistance of amplifier 16 is less than the resistance of feedback element 18, the bandwidth of the amplifier increases as $R_f$ becomes smaller. This may be acceptable over a preselected range depending upon the application so long as the amplifier remains stable. In such a case it may be necessary or desirable to add additional filtering to reduce the noise bandwidth of the circuit. $R_f$ could be a FET the resistance of which is controlled by an AGC loop, two or more resistors which are switched in and out of the feedback circuit by an AGC loop or other means to change the effective resistance.

Figure 2:
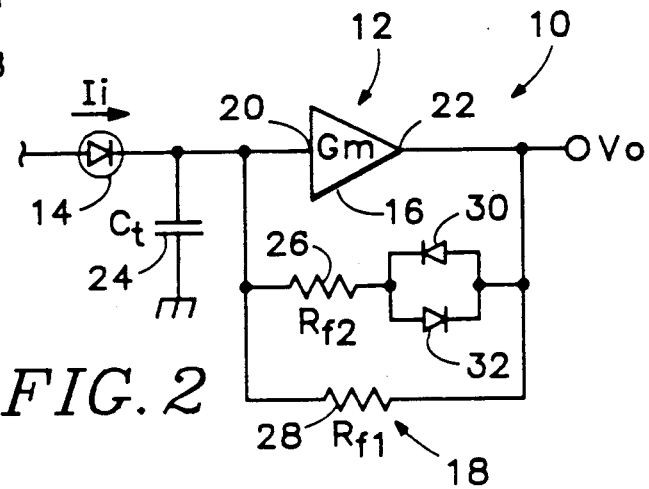
FIG. 2 is a diagram similar to FIG. 1 illustrating additional detail concerning the amplifier feedback element.

One embodiment of variable resistive feedback element 18 is depicted in FIG. 2. Included therein are a pair of resistors 26, 28 and a pair of diodes 30, 32. When the polarity of the anode of diode 30 is positive relative to output terminal 22 and when the amplitude of the signal is sufficient, diode 30 conducts and diode 32 is shut off. When the polarity of the cathode of diode 32 is negative relative to output terminal 22 and when the amplitude of the signal is sufficient, diode 32 conducts and diode 30 is shut off. For small values of $v_o$, diodes 30, 32 do not conduct regardless of polarity. Resistive feedback element 18 is thus both nonlinear and symmetrical with respect to the polarity of the signal applied thereacross.

When diodes 30, 32 are both off, resistor 28 establishes the transimpedance of amplifier 12 with resistor 26 being effectively disconnected. When $v_o$ exceeds the on-voltage of diodes 30, 32, one of the diodes start to conduct. This places resistor 26 in parallel with resistor 28 thus reducing the gain of transimpedance amplifier 12. For a square wave input current, which is common for receivers such as circuit 10, the diodes alternate conditions as follows: neither is on, one is on, neither is on, the other is on, neither is on, etc.

In a slightly modified embodiment, resistor 26 is omitted thereby placing diodes 30, 32 in parallel with resistor 28. The value of resistor 28 is chosen sufficiently large to increase sensitivity, i.e., reduce noise, while resistor 26 is chosen to avoid overload for the largest anticipated value of $i_i$.

Figure 3:
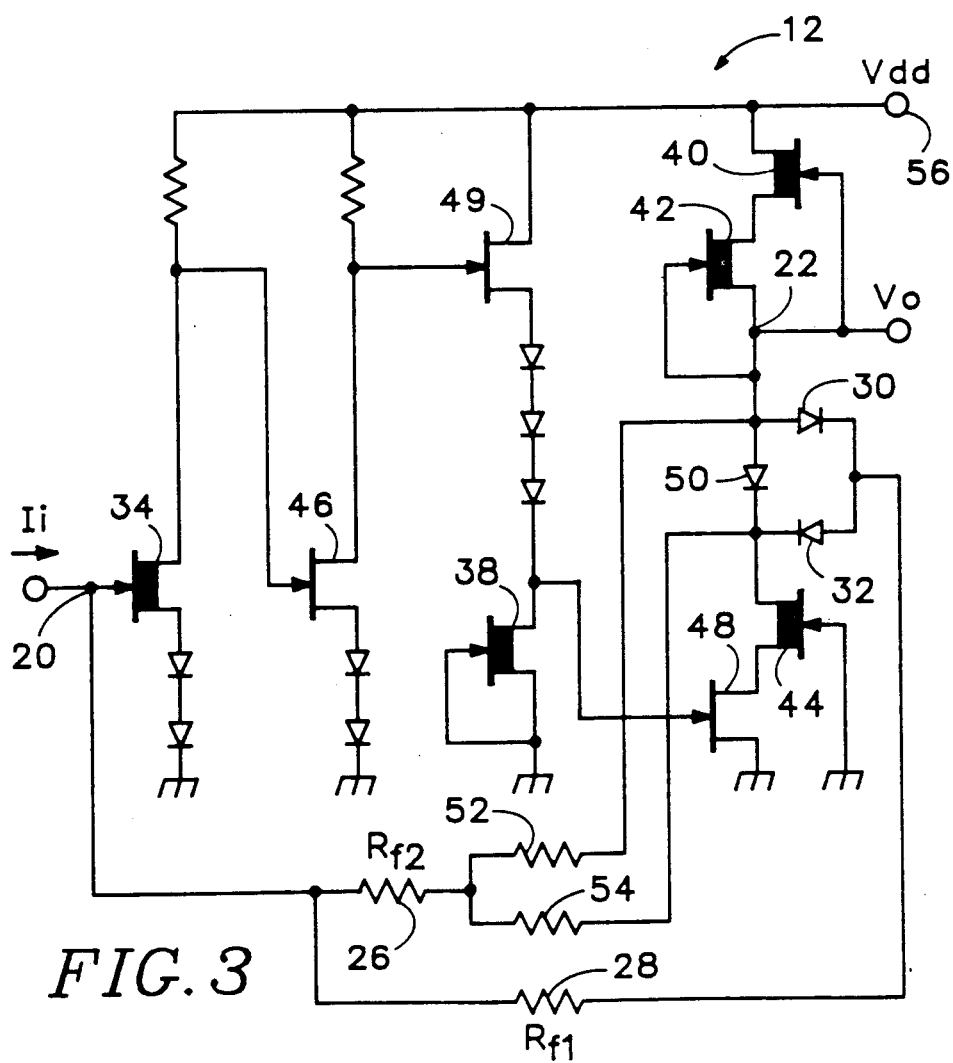

Turning now to FIG. 3, illustrated therein is a more detailed schematic of transimpedance amplifier 12, including a slightly modified embodiment of variable resistive feedback element 18. The structure which corresponds to that previously identified retains the same numeral in FIG. 3.

The transimpedance amplifier of FIG. 3 is implemented in GaAs technology. Included therein are depletion FETs 34–44 and enhancement FETs 46, 48, 49. A biasing diode 50 is disposed between the anode of diode 30 and the cathode of diode 32 as shown. Resistors 52, 54 are of equal value and are joined at one end to one side of resistor 26 as shown, with the other end of resistor 52 being connected to the anode of diode 30 and the other end of resistor 54 being connected to the cathode of diode 32. A conventional voltage supply (not shown) is applied to a terminal 56.

In operation, FETs 34, 49, 46, 48 are driven in response to a signal appearing on terminal 20. FETs 40, 42 comprise a bootstrapped current-source load that provides a relatively high resistance. The diodes connected to the sources of FETs 34, 46, 49 provide appropriate biasing voltage for the FETs associated therewith. The voltage supply on terminal 56 sets up a standing current in biasing diode 50 which is on when power is applied to the circuit. Thus, the voltage required across diodes 30, 32 to start conduction thereof is reduced by half due to the on-voltage drop across diode 50. Typically, a GaAs Schottky diode requires approximately 600–700 millivolts thereacross before conduction begins. With the biasing caused by diode 50, now only approximately 300 millivolts is needed across diode 30 or diode 32 to begin conduction thereof.

Thus, diodes 30, 32 begin conduction, alternately, in response to a square wave having a peak-to-peak voltage of approximately 0.7 volts appearing on terminal 22. In the embodiment of FIG. 2, on the other hand, a peak-to-peak voltage of approximately 1.4 volts is required before conduction occurs through either of diodes 30, 32. Thus, for small signals, i.e., current inputs which generate less than approximately 0.7 volts peak-to-peak on terminal 22, diodes 30, 32 do not conduct and resistor 28 is not included in the feedback path. When such is the case, the resistance in the path is equal to the resistance of resistor 26 plus ½ the resistance of resistor 52 (as will be recalled, the resistance of resistor 52 is equal to the resistance of resistor 54).

When the peak-to-peak voltage appearing on terminal 22 exceeds approximately 0.7 volts, diodes 30, 32 begin alternate conduction thus joining resistor 28 in parallel with resistors 26, 52, 54 in the feedback path.

Figure 4:
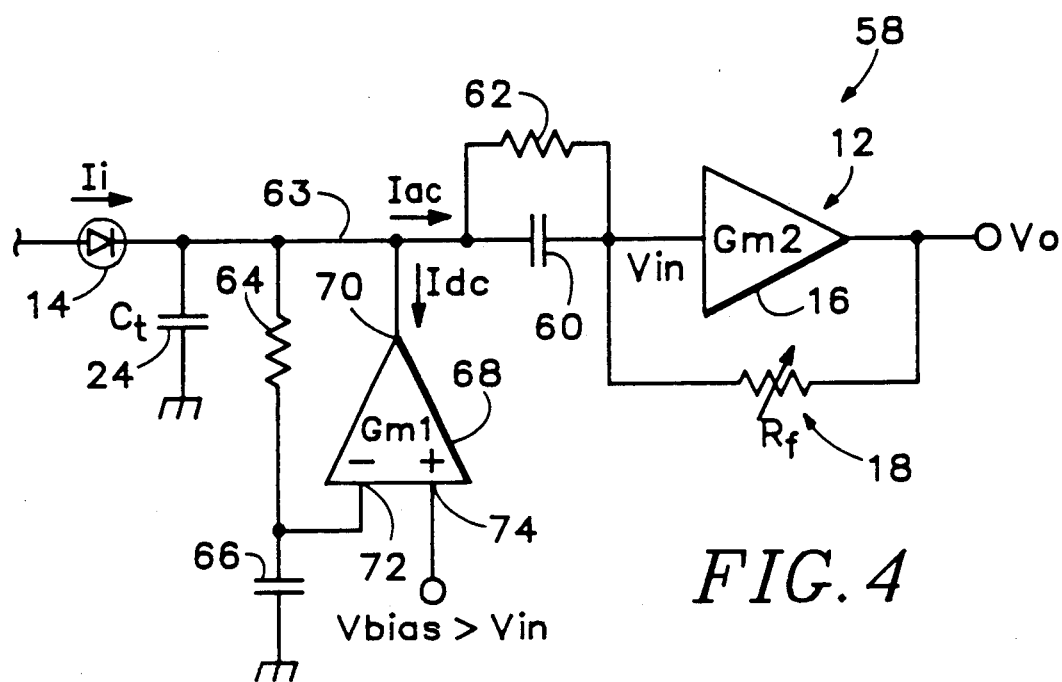
FIG. 4 is a second embodiment of the transimpedance amplifier constructed in accordance with the present invention.

Turning now to FIG. 4, indicated generally at 58 is another embodiment of an optical receiver circuit constructed in accordance with the present invention. Structure which has been previously identified and which is included in circuit 58 retains the same numeral therein. Circuit 58 further includes a capacitor 60, such being referred to herein as means for AC coupling a current signal. A resistor 62 is in parallel with capacitor 60. Capacitor 60 and resistor 62 each have one end connected to the input of amplifier 16 and the other connected to a conductor 63. A resistor 64 has one end connected to conductor 63 and the other end connected to a capacitor 66 as shown.

A second transconductance amplifier 68 includes an output terminal 70, an inverting input terminal 72 and a non-inverting input terminal 74. Output terminal 70 is electrically tied to conductor 63, input terminal 72 is connected to the juncture of resistor 64 and capacitor 66 and terminal 74 is applied to a bias voltage. In circuit 58, the bias voltage is slightly larger than the steady state DC voltage on the input to amplifier 16 when no input current signal is applied thereto.

Circuit 58 has lower pulse edge distortion than that of circuit 10 and increased dynamic range. Amplifier 68 absorbs the DC or average value of the input signal allowing the remainder of the signal to be AC coupled to amplifier 12. This is necessary to prevent pulse edge distortion. Additionally, by removing the DC component of the input signal, amplifier 68 increases the dynamic range of amplifier 12.

In operation, resistor 64 and capacitor 66 form a low-pass filter which produces a voltage at the juncture of resistor 64 and capacitor 66 which is proportional to the average level of the voltage generated by diode 14 in conductor 63. As the current through diode 14 increases, the voltage on terminal 72 increases until amplifier 68 turns on. When the average signal level in conductor 63 is high enough so that the voltage applied to terminal 72 of amplifier 68 exceeds the bias voltage applied to terminal 74, the amplifier turns on thereby conducting a DC current as indicated by the arrow into terminal 70. The current has a level determined by the voltage applied to terminal 72 and maintains the voltage on conductor 63 substantially equal to the voltage on terminal 74 for sufficiently large input signals. Capacitor 60 couples the AC current signal to transimpedance amplifier 12 which operates thereon as previously described.

Since variable resistive feedback element 18, in FIG. 2, is both nonlinear and symmetrical the input signal must be AC coupled to assure that the feedback network will operate symmetrically on the signal. If the signal were level shifted relative to the normal amplifier output voltage, with no input signal applied, the amplified signal would be distorted in a nonsymmetrical way. For a square wave signal such distortion occurs on the pulse edges and could shift the pulse edges thereby closing the "eye" of the data pattern and increasing the error rate.

For current in conductor 63 which is low enough so that the voltage applied to terminal 72 causes amplifier 68 to be turned off, no current is shunted via terminal 70 of amplifier 68. This preserves the sensitivity of transimpedance amplifier 12 when the input signals in conductor 63 are small.

Figure 5:
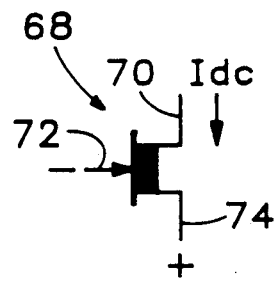
FIG. 5 is a more detailed diagram of a portion of the amplifier shown in FIG. 4.

FIG. 5 illustrates one embodiment of amplifier 68, namely a FET. The terminal numerals in FIG. 4 for amplifier 68 are used to identify the corresponding connections on the FET in FIG. 5 when it is used in the circuit of FIG. 4. As the voltage increases on terminal 72 (which corresponds to an increase in current in conductor 63), FET 68 becomes more conductive and increased current is shunted from conductor 63.

Figure 6:
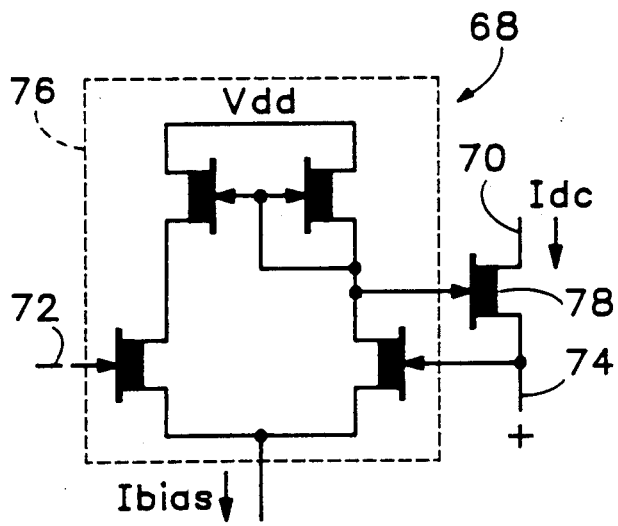
FIG. 6 is a modified version of that portion of the amplifier shown in FIG. 5.

FIG. 6 illustrates a different embodiment of amplifier 68 and includes an op amp 76, enclosed in a dashed line, driving a FET 78. Numerals identified in FIG. 4 are again used in FIG. 6 to identify corresponding terminals. The embodiment of amplifier 68 in FIG. 6 provides a more accurate transconductance amplifier than the embodiment of FIG. 5.

Figure 7:
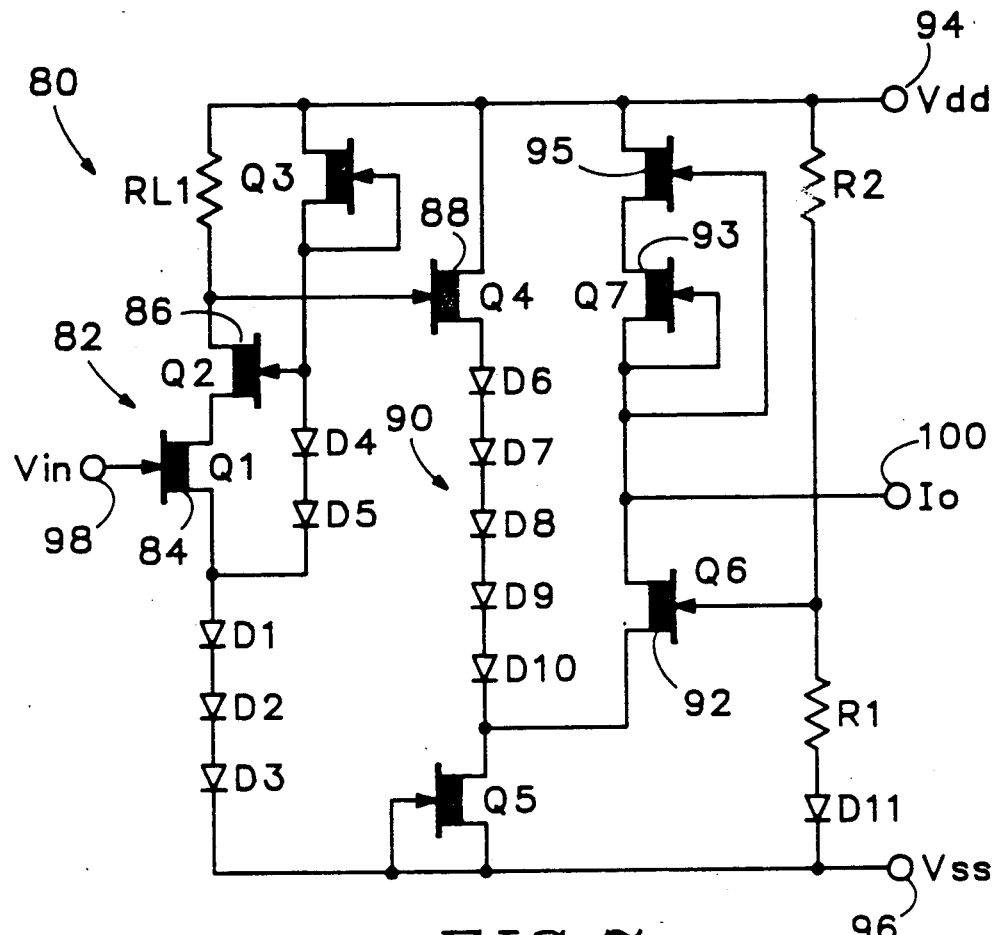
FIG. 7 is a more detailed diagram of another portion of the amplifier shown in FIG. 4.

Turning now to FIG. 7, indicated generally at 80 is a circuit diagram of another embodiment of a transconductance amplifier which is suitable for implementing transimpedance amplifier 12 of FIGS. 1, 2 and 4.

Circuit 80 comprises a two-stage amplifier having a common source cascade input stage, indicated generally at 82, and comprising FETs 84, 86. The input stage drives a source follower, comprising a FET 88. A diode level shifter, indicated generally at 90, provides a signal to a common gate stage comprising a FET 92. FETs 93, 95 provide a high impedance bootstrapped load in a similar way to that of FETs 40, 42 in FIG. 3. Conventional power supply voltage levels are provided to terminals 94, 96. An input terminal 98 is tied to the gate of FET 84 and an output terminal 100 is provided as shown. As will be readily apparent to a person having ordinary skill in the art, when terminal 100 is applied to a load, a varying voltage applied to input terminal 98 produces a corresponding current in the load. Circuit 80 provides a relatively large output impedance.

Figure 8:
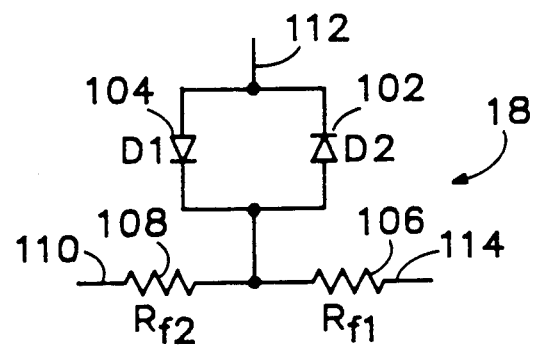
FIG. 8 is a modified version of the amplifier feedback element.

Turning now to FIG. 8, illustrated therein is another embodiment of variable resistive feedback element 18 in FIG. 2. Included therein are a pair of diodes 102, 104 and a pair of resistors 106, 108 and conductors 110, 112, 114. The FIG. 8 feedback element is connected to circuit 80 in FIG. 7 as follows: conductor 110 is electrically connected to input terminal 98 and conductor 114 is electrically connected to output terminal 100. Conductor 112 can be connected either to the source or gate of FET 88. Conductor 112 may need to be AC coupled with a capacitor or connected at an appropriate tap on level shifting diodes 90. For the following description of operation of the feedback element of FIG. 8, assume conductor 112 is AC coupled to the gate of FET 88.

Typically resistor 106 is much larger than resistor 108. For small signal levels through resistors 106, 108 diodes 102, 104 do not conduct. As the signal levels increase, one of the diodes, depending upon the polarity of the voltage thereacross, conducts thus placing resistor 108 in a feedback loop around the first stage of amplifier 80, such comprising FETs 84, 86. This reduces the gain of the first stage thereby reducing the overall gain of circuit 80. Since fewer stages of the amplifier are enclosed in the nonlinear feedback loop circuit 80 exhibits greater bandwidth and/or less peaking.

Having illustrated and described the principles of my invention in a preferred embodiment thereof, it should be readily apparent to those skilled in the art that the invention can be modified in arrangement and detail without departing from such principles. I claim all modifications coming within the spirit and scope of the accompanying claims.

I claim:

1. A transimpedance amplifier comprising:
   a transconductance amplifier having an input terminal and an output terminal, the input terminal having an associated input capacitance; and
   a feedback element disposed between said input terminal and said output terminal, said feedback element having a resistance which is substantially equal to or less than the output resistance of said transconductance amplifier, such that the transimpedance amplifier has a substantially constant bandwidth with resect to the value of the feedback element.

2. The amplifier of claim 1 wherein the resistance of said feedback element is variable between a lower level and an upper level.

3. The transimpedance amplifier of claim 2 wherein said feedback element is passive.

4. The transimpedance amplifier of claim 3 wherein said feedback element comprises a diode and a resistor.

5. The amplifier of claim 2 wherein said resistance is nonlinearly variable.

6. The amplifier of claim 5 wherein said resistance is substantially the same for a selected signal amplitude applied thereacross regardless of the polarity thereof.

7. The transimpedance amplifier of claim 1 wherein said feedback element comprises:
   a first branch having a first resistor; and
   a second branch in parallel with said first branch and having a second resistor and a diode disposed therein so that for voltages less than the on-voltage of said diode across said feedback element, current flow in said feedback element is through said first branch and for voltages greater than the on-voltage of said diode across said feedback element, current flow is through both branches.

8. The transimpedance amplifier of claim 1 wherein said transimpedance amplifier further includes means for AC coupling a current signal to said input terminal.

9. The transimpedance amplifier of claim 8 wherein said coupling means comprises a capacitor.

10. The transimpedance amplifier of claim 8 wherein said transimpedance amplifier further comprises means for removing DC current from an input signal applied to said coupling means.

11. The transimpedance amplifier of claim 10 wherein said amplifier further includes means for disabling said means for removing DC current when the magnitude of an input signal applied to said coupling means falls below a preselected level.

12. The transimpedance amplifier of claim 10 wherein said means for removing DC current comprises:
means for developing a signal related to the DC current level of an input signal applied to said coupling means;
a transconductance amplifier having an output connected to said coupling means and an input connected to said signal developing means.

13. The transimpedance amplifier of claim 10 wherein said means for removing DC current comprises:
means for developing a signal related to the DC current level of an input signal applied to said coupling means;
a FET having one side thereof connected to said coupling means, the other side thereof connected to a preselected potential and a gate connected to said signal developing means.

14. A method of producing a voltage signal proportional to a current signal comprising the steps of:
providing a transconductance amplifier having an input terminal with an associated input capacitance, an output terminal, and a feedback element disposed between said input terminal and said output terminal, said feedback element having a resistance which is substantially equal to or less than the output resistance of said transconductance amplifier;
providing a current signal on said input terminal; and
varying the resistance of said feedback element, wherein the bandwidth of the voltage signal remains substantially constant with respect to the value of the feedback element.

15. The method of claim 14 wherein the step of vary the resistance of said feedback element further includes the step of maintaining the resistance of said feedback element at a value which is substantially equal to or less than the output resistance of said transconductance amplifier.

16. The method of claim 15 wherein said method further comprises the step of AC coupling the current signal to said input terminal.

17. The method of claim 16 wherein said method further includes the steps of:
monitoring the magnitude of the current signal; and
removing DC current from the current signal when the magnitude thereof rises above a preselected level prior to the step of AC coupling the current signal to said input terminal.

18. The method of claim 14 wherein said method further comprises the step of AC coupling a current signal to said input terminal.

19. The method of claim 18 wherein the step of varying the resistance of said feedback element further comprises the step of nonlinearly varying said resistance.

20. The method of claim 19 wherein the step of varying the resistance of said feedback element further comprises the step of varying said resistance symmetrically with respect to the polarity of a signal applied thereacross.

21. An optical receiver circuit for an incoming optical signal having a variable power level comprising:
an optical detector for receiving said optical signal and generating a current therefrom which varies with the optical signal power level;
a transconductance amplifier having an input terminal and an output terminal, the input terminal having an associated input capacitance;
means for applying the current to the input terminal;
a resistive feedback element disposed between the input terminal and the output terminal, said resistive feedback element having a resistance that is substantially equal to or less than output resistance of said transconductance amplifier; and
means for varying the resistance of said resistive feedback element thereby varying the power level of said optical receiver circuit, wherein the bandwidth of said optical receiver circuit remains substantially constant with respect to the value of said resistive feedback element.

22. The circuit of claim 21 wherein said means for varying the resistance of said feedback element includes means for varying the resistance responsive to the magnitude of current applied to said input terminal.

23. The circuit of claim 21 wherein said circuit further includes means for AC coupling a current signal to said input terminal.

24. The circuit of claim 23 wherein aid circuit further includes means for removing DC current from a current signal applied to said AC coupling means.

25. An amplifier for generating a voltage signal proportional to a current signal comprising:
a transimpedance amplifier having a first transconductance amplifier, a feedback element coupled thereacross, and an input terminal with an associated input capacitance, such that the bandwidth of the transimpedance amplifier is constant with respect to the value of the feedback element;
means for developing a voltage signal related to the DC signal level of an input signal applied to the input terminal of said transimpedance amplifier; and
a transconductance amplifier having an output connected to said input terminal and an input connected to said voltage developing means.

26. The amplifier of claim 25 wherein aid amplifier further comprises means for disabling said transconductance amplifier when such a voltage signal falls below a preselected value.

27. A method of producing a voltage signal proportional to a current signal comprising the steps of:
providing a transconductance amplifier having an input terminal, an output terminal, and a feedback element disposed between said input terminal and said output terminal, said feedback element having a resistance which is substantially equal to or less than the output resistance of said transconductance amplifier;
providing a current signal on said input terminal;
monitoring the magnitude of the current signal;
removing DC current from the current signal when the magnitude thereof rises above a preselected level;

AC coupling the current signal to said input terminal;
varying the resistance of said feedback element; and
maintaining the resistance of said feedback element at a value which is substantially equal to or less than the output resistance of said transconductance amplifier.

* * * * *